(12) United States Patent
Schemmer (10) Patent No.: US 9,077,263 B2
(45) Date of Patent: Jul. 7, 2015

(54) DEVICE AND METHOD FOR EMULATING AN ACTUATOR

(76) Inventor: Benedikt Schemmer, Dreieich (DE)

( * ) Notice: Subject to any disclaimer, the term of this patent is extended or adjusted under 35 U.S.C. 154(b) by 1149 days.

(21) Appl. No.: 12/682,551

(22) PCT Filed: Oct. 10, 2008

(86) PCT No.: PCT/DE2008/075007
§ 371 (c)(1),
(2), (4) Date: Apr. 9, 2010

(87) PCT Pub. No.: WO2009/074152
PCT Pub. Date: Jun. 18, 2009

(65) Prior Publication Data
US 2010/0250092 A1    Sep. 30, 2010

(30) Foreign Application Priority Data
Oct. 11, 2007    (DE) .......................... 10 2007 049 023

(51) Int. Cl.
| B25J 9/16 | (2006.01) |
| H01L 41/00 | (2013.01) |
| H03G 3/00 | (2006.01) |
| H02N 2/00 | (2006.01) |
| H01L 41/09 | (2006.01) |

(52) U.S. Cl.
CPC .......... *H02N 2/0075* (2013.01); *H01L 41/0906* (2013.01)

(58) Field of Classification Search
CPC ..... G05B 19/425; G05B 19/42; B60W 10/06; F02D 2041/001

USPC ........................... 318/568.1; 310/317; 381/61
See application file for complete search history.

(56) References Cited

U.S. PATENT DOCUMENTS

| 4,613,782 A | 9/1986 | Mori et al. |
| 5,444,347 A | 8/1995 | Volk |
| 5,663,713 A * | 9/1997 | Ironside et al. ............... 340/661 |
| 6,547,699 B2 * | 4/2003 | Eich et al. ..................... 477/175 |
| 2002/0035015 A1 * | 3/2002 | Eich et al. ..................... 477/175 |

(Continued)

FOREIGN PATENT DOCUMENTS

| DE | 10063535 | 7/2002 |
| DE | 10143502 | 3/2003 |

(Continued)

OTHER PUBLICATIONS

Duan et al., "Finite element solution for intermittent-contact problem with piezoelectric actuation in ring type USM," Finite Elements in Analysis and Design, vol. 43, pp. 193-205 (Dec. 2006) (14 pages).

(Continued)

*Primary Examiner* — Eduardo Colon Santana
*Assistant Examiner* — Gabriel Agared
(74) *Attorney, Agent, or Firm* — Wilmer Cutler Pickering Hale and Dorr LLP (57) ABSTRACT

A device for emulating at least one first actuator has at least one electric network connected to at least one control electronic circuit. The electric network is operatively connected to at least one second actuator by at least one first control and/or regulating unit. At least one first parameter of the electric network can be changed by the first control so that the technical characteristics of the emulation device match those of a device that is to be emulated.

14 Claims, 4 Drawing Sheets

(56) References Cited

U.S. PATENT DOCUMENTS

2004/0127329 A1* 7/2004 Eich et al. .................. 477/34
2004/0163628 A1   8/2004 Melbert
2004/0189388 A1* 9/2004 Nguyen et al. ............. 330/254
2005/0078835 A1* 4/2005 Baugh et al. ............... 381/61

FOREIGN PATENT DOCUMENTS

| DE | 10158584 | 7/2003 |
|----|----------|--------|
| EP | 0155694  | 9/1985 |
| JP | 04140080 | 5/1992 |
| JP | 2005164369 | 6/2005 |

OTHER PUBLICATIONS

International Search Report mailed on May 27, 2009 for International Patent Application No. PCT/DE2008/075007, filed Oct. 10, 2008 (3 pages).

* cited by examiner

DEVICE AND METHOD FOR EMULATING AN ACTUATOR

CROSS REFERENCE TO RELATED APPLICATIONS

This application is a U.S. National Phase application under 35 U.S.C. §371 of International Patent Application No. WO 2009/074152, which claims the benefit of the filing date of German Patent Application No. DE 10 2007 049 023.4 filed Oct. 11, 2007, the disclosures of which is hereby incorporated herein by reference.

FIELD OF THE INVENTION

The invention relates to a device for emulating at least a first actuator as well as to a method for emulating a first actuator, in particular by a device according to the invention.

BACKGROUND OF THE INVENTION

Devices, by which different load situations may be emulated by an actuator, are known from the state of the art. For instance, JP 04 140 080 A discloses a device and method for performing an abrasion test for an ultrasonic engine. A piezoelectric vibrator is used to exert vibrations onto a stator, which is in slipping contact with a rotor, which is driven by an engine. This makes it possible to emulate an abrasion situation, as it occurs under actual conditions.

A similar abrasion test mechanism may be found in JP 2005 164 369 A. An element, which is to be tested, is pressed against a rotor by a weight. The contact pressure of the test element against the rotor is thereby changed by a piezoelectric element comprising a vibrator.

These devices known from JP 04 140 080 A and JP 2005 164 369 A, however, do not allow for data, which is required for the development of an actuator, in particular of a piezoelectric actuator, to be determined.

SUMMARY OF THE INVENTION

The present invention provides for a device and a method for emulating a planned first actuator, which make it possible in a simple and cost-efficient manner to be able to make predictions relating to the behavior of the planned first actuator. In particular, provision is to be made for a device and a method, which make it possible to simulate the behavior of the planned first actuator as comprehensively as possible independent of production tolerances.

According to an exemplary embodiment of the invention there is provided a device for emulating at least a first actuator, comprising at least one electric network, which may be connected to at least one electronic control circuit, wherein the electric network is operatively connected to at least a second actuator by at least a first control unit and wherein at least a first parameter of the electric network may be changed by the first control unit.

Different methods are possible for developing actuators, in particular piezoelectric actuators: analytic modeling, finite elements method (FEM), simulation and the test with prototypes. Each method has its advantages: the analytic modeling allows the most insight into the basic mechanisms of the actuator. It may be difficult or also impossible, however, to know and to model all acting effects.

The FEM simulation makes it easy to perform parameter variations and to simulate a friction-locked power transmission to a load, which is connected to the actuator. However, the simulation may be hereby only as good as the models, on which it is based. For instance, current simulation programs (ANSYS, ABAQUS), e.g., are not able to simulate non-linear effects of a piezoceramics, for example.

The test of prototypes allows for the quick and pragmatic testing of assumptions made in the two preceding methods in reality. However, tolerances of the prototype, which are created by the production or the material, respectively, may generally not be detected completely. For cost and time reasons, it may be furthermore generally not possible to completely examine an actuator. Typically, only a few new actuators (occasionally only a single actuator) are simulated, assembled and measured.

Provision may thereby in particular be made for the first actuator to comprise at least one piezoelectric actuator, at least one combustion engine, at least one electromotor, at least one electromagnet, at least one electrostatic actuator, at least one magneto-resistive actuator and/or at least one electro-active polymer.

In the case of the afore-described embodiments, provision may be made for the second actuator to comprise at least one piezoelectric actuator, at least one combustion engine, at least one electromotor, at least one electromagnet, at least one electrostatic actuator, at least one magneto-resistive actuator and/or at least one electro-active polymer. The invention also proposes for the first actuator and the second actuator to encompass different mechanisms of action.

It is also proposed for the second actuator to be capable of being connected, in particular by at least a first connecting device, to at least one load, which may be driven by the second actuator. In the case of the afore-mentioned alternative, the invention proposes for the first connecting device to be embodied in the form of at least one tip, which may be exchanged.

According to the invention it is further possible for the second piezoelectric actuator to comprise at least one piezoelectric stack actuator and/or for the second piezoelectric actuator to comprise at least two piezoelectric drive mechanisms.

A particular embodiment of the invention provides for the second actuator to be operatively connected to at least one sensor, for example to at least two sensors, for detecting at least one deflection of the second actuator in at least one spatial direction, for example in at least two, in particular orthogonal spatial directions, and/or for detecting at least one trajectory of the first connecting device. It is possible in the case of the afore-mentioned embodiment for the sensor to comprise at least one contact-free, for example capacitive, inductive and/or optical, in particular interferometric range sensor.

The invention further proposes for the second actuator to encompass at least one resonance frequency, which is the same or greater than at least one resonance frequency of the first actuator. A particular embodiment of the invention provides for the electric network to comprise passive components and/or active components.

The invention further provides for an electric impedance, in particular the electric input impedance of the first actuator to be capable of being emulated by the electric network, for example for the device to encompass the electric impedance of the first actuator in response to the control of the second actuator, in particular by the electronic control circuit.

A particular embodiment of the invention provides for the electric network comprising at least one elementary cell to comprise at least a first, for example changeable electric capacitance arrangement, in particular comprising at least one capacitor, and a series connection, which may be connected parallel to the first electric capacitance arrangement, comprising of at least one, for example changeable electric inductance arrangement, in particular comprising at least one coil, at least one, for example changeable second electric capacitance arrangement, in particular comprising at least one capacitor and/or at least a first, for example changeable electric resistance arrangement, in particular comprising at least one electric resistance.

For the two afore-mentioned embodiments, the invention proposes for the electric network to comprise at least two or a plurality of elementary cells, wherein at least two elementary cells are connected parallel to one another.

The invention also proposes for the elementary cell and/or for at least one of the elementary cells to comprise at least a second, for example changeable electric resistance arrangement, wherein for example the second electric resistance arrangement comprises at least one semiconductor component, such as a transistor, for example at least one field effect transistor, in particular in the form of at least one MOSFET.

A device according to the invention may further be characterized in that, as first parameter, at least one capacitance value of the first electric capacitance arrangement and/or of the second electric capacitance arrangement, at least one inductance value of the electric inductance arrangement and/or at least one resistance value of the first electric resistance arrangement and/or of the second electric resistance arrangement of the elementary cell and/or of at least one of the elementary cells, to be changeable, in particular chronologically prior to and/or during a control and/or movement of the second actuator.

In the case of this embodiment, it is possible for the first electric capacitance arrangement and/or for the second electric capacitance arrangement to comprise at least two or a plurality of individual capacitors, which may in particular be connected parallel to one another, for the inductance arrangement to comprise at least two or a plurality of individual inductances, which may in particular be connected in series to one another, and/or for the first electric resistance arrangement and for the second electric resistance arrangement to comprise at least two or a plurality of ohmic individual resistances, which may be connected in series and/or parallel to one another, wherein at least two individual capacitors for example encompass different capacitance values, at least two individual inductances encompass different inductance values and/or at least two ohmic individual resistances encompass different resistance values and/or the interconnection of the individual capacitors, of the individual inductances and/or of the individual resistances may be changed by the first control unit, in particular by impacting at least one circuit, which may be comprised by the first electric capacitance arrangement, the second electric capacitance arrangement, the inductance arrangement, the first electric resistance arrangement and/or the second electric resistance arrangement.

The invention also proposes for the first control unit to comprise at least one microcontroller and/or to be operatively connected to the electronic control circuit, the second actuator, the sensor and/or the load.

Finally, the device according to the invention may be characterized by at least a second control unit in operative connection to the electronic control circuit, the first control unit, the second actuator, the sensor and/or the load, wherein the second control unit for example comprises at least one computer terminal.

The invention further provides for a system for emulating at least a first actuator, comprising at least one emulation unit, which comprises at least one device according to the invention. The invention thereby proposes for different actuators, which may be used in the emulation unit, in particular for driving at least one drive unit of the emulation unit, to be capable of being emulated by the device.

For the system, the invention also proposes for the emulation unit to be mobile, in particular for at least one drive unit of the emulation unit to be capable of being driven by the second actuator of the device, wherein the emulation unit may for example be embodied in the form of at least one motor vehicle, at least one aircraft, at least one rail vehicle and/or at least one watercraft.

The invention furthermore proposes for the system to further comprise at least one power supply unit, wherein the power supply unit may be operatively connected to the emulation unit, in particular for supplying the device with power. In a first alternative embodiment, provision may thereby be made for the power supply unit to at least be partially comprised by the emulation unit.

In a second alternative embodiment, provision may be made for the power supply unit to be embodied separately from the emulation unit, in particular in the form of a vehicle, which may be separated from the emulation unit, such as in the form of a motor vehicle, aircraft, rail vehicle and/or watercraft and/or for the power supply unit and the emulation unit to be embodied in the form of different vehicle types.

The invention for the system furthermore proposes for the system to comprise at least one vibration generating mechanism, wherein vibrations may be transferred onto the emulation unit and/or the drive unit of the emulation unit in particular by the vibration generating mechanism and/or vibrations in the infrasonic range, in the audible range, in the inaudible range and/or in the ultrasonic range may be generated by the vibration generating mechanism.

A system according to the invention may also be characterized in that the vibration generating mechanism may be operatively connected to the first control unit, the second control unit, the second actuator and/or the load.

The present invention further provides for a method for emulating at least a first actuator, wherein the method comprises the provision of at least a second actuator and of at least one electric network, which may be operatively connected to the second actuator for emulating at least one impedance of the first actuator, in particular by the provision of a device according to the invention and by the adjusting of at least a first parameter of the electric network as a function of at least a second parameter of the first actuator. Provision may thereby in particular be made for the second parameter to be determined by at least one simulation of the first actuator, in particular a finite elements method (FEM) simulation, by at least one analytic modeling of the first actuator and/or by at least one measuring, in particular of at least one prototype and/or of a copy of the first actuator, which may be taken from a current series, and/or for at least one transfer factor of the first actuator to be determined as second parameter.

In the case of both of the afore-mentioned alternative embodiments of the invention, it is furthermore proposed for the adjustment of the first parameter to comprise the adjustment of at least one capacitance value, in particular of at least a first electric capacitance arrangement and/or of at least a second electric capacitance arrangement of the electric network, of at least one inductance value, in particular of an inductance arrangement of the electric network, and/or of at least one resistance value, in particular of at least a first electric resistance arrangement and/or of at least a second electric resistance arrangement, for example by a first control unit, which may be operatively connected to the second actuator and/or the electric network.

It is also proposed for the method according to the invention for the second actuator to be made to carry out at least a first, in particular a translatory and/or rotatory movement, following the adjustment of the first parameter, for example along at least a first predetermined trajectory, in particular by applying at least a control signal to the second actuator, wherein a second movement, in particular a translatory and/or rotatory movement of the first actuator, is emulated in particular by the first movement. It is thereby particularly possible for the control signal to be applied to the second actuator via the electric network and/or at least one electronic control circuit.

In the case of both of the afore-mentioned embodiments, the invention proposes for at least a third parameter of the first actuator to be determined by an evaluation/analysis of the first movement of the second actuator, wherein on the one hand at least one context between at least one voltage value, at least one frequency value and/or at least one current value of the control signal and, on the other hand, at least one deflection value, at least one acceleration value, at least one force value of at least one force built up via the second actuator and/or of at least one performance value of the second actuator may be determined, in particular as third parameter. A method according to the invention may furthermore be characterized in that at least one load may be applied to the second actuator during the first movement.

The invention also proposes for a fourth parameter of the electric network to be changed prior to, during and/or after carrying out the first movement of the second actuator, in particular as a function of the third parameter and/or of the load applied to the second actuator.

Provisions may further be made for the fourth parameter to correspond to the first parameter and/or for at least one resistance value of the second electric resistance arrangement to be changed as fourth parameter.

The invention for the method also proposes for the third parameter to be used to perform a simulation, in particular a finite elements method (FEM) simulation of the first actuator and/or at least one analytic modeling of the first actuator, in particular to adapt the simulation and/or the modeling for the determination of the second parameter and/or for the third parameter to be used so as to change at least a fifth parameter of the electric electronic control circuit.

The invention further proposes for at least one piezoelectric actuator, at least one combustion engine, at least one electromotor, at least one electromagnet, at least one electrostatic actuator, at least one magneto-resistive actuator and/or at least one electro-active polymer to be emulated as first actuator.

Provision may furthermore be made for at least one piezoelectric actuator, at least one combustion engine, at least one electromotor, at least one electromagnet, at least one electrostatic actuator, at least one magneto-resistive actuator and/or at least an electro-active polymer to be provided as second actuator.

The method according to the invention may be characterized in that performance characteristics, such as a mechanical performance, vibration characteristics, such as vibrations in the audible and/or inaudible range, and/or drive characteristics, such as a constancy of movement, of the first actuator are emulated by the emulation.

In addition to the emulation of the first actuator, it is also possible for at least one additional unit, which may be at least in indirect operative connection to the first actuator, such as at least one transmission, at least one brake and/or a coupler to be emulated by the method.

The invention furthermore proposes for the emulation of the additional unit to be carried out by influencing the first parameter, the second parameter and/or the fourth parameter and/or by the first control unit.

Finally, the invention proposes for different first actuators to be emulated during an emulation process, in particular by influencing the first parameter, the second parameter and/or the fourth parameter, for example as a function of actuator profiles, which are stored in the first control unit.

The invention is thus based on the surprising realization that a development of a planned first actuator may be simplified and that better predictions relating to the behavior of this planned actuator may be made at the same time, in that a device and a method for emulating the first actuator is provided, in the case of which parameters of the first actuator or of the actuator, which is to be emulated, respectively, which are found in the analytic or FEM description or by measuring a prototype, are transferred into a mechanical system, which encompasses a reproducible behavior. The device for emulating or simulating, respectively, thereby comprises an electrical and a mechanical part, which are connected to one another via a first control unit, such as a microcontroller.

The electrical part in the form of an electric network serves the purpose of simulating an impedance of the emulated first actuator, while the mechanical part, which comprises a second piezoelectric actuator, simulates the movement of the actuator, relative to the contact point to the controlled body (=load).

Contrary to a simulation, effects, such as non-linear effects of a piezoceramics, which cannot be detected even by simulation programs, are also emulated or simulated, respectively, by the device according to the invention and by the method according to the invention. The reason for this is that a simulation on a PC is carried out by a virtual system, while according to the device according to the invention and the method according to the invention a simulation of the behavior of the planned first actuator is carried out by an emulator, which comprises an actual, functional actuator and an actual, electronically changeable impedance.

In the case of an embodiment of the method according to the invention, provision is made for the following course: parameters of an electric equivalent circuit diagram of the planned, in particular piezoelectric actuator, which are acquired by analytic or FEM computations, respectively, or by measuring a prototype of the planned actuator, are computed and are transferred to a first control unit, which in particular comprises at least one microcontroller and which then adapts the electric network accordingly. The coupling between the electric network and the second, in particular piezoelectric actuator may be predetermined (if desired) by a computed transformer constant. Due to the fact that both emulator parts are not rigidly connected, they may also be used completely independent on one another.

A movement of the second actuator, in particular of a tip, which may be connected to a second piezoelectric actuator, may be predetermined for carrying out the emulation of the planned actuator. The movement of the second actuator or of the tip, respectively, may be detected by sensors. It is thus possible to pass through any trajectory.

The passing through with respective trajectories at an actual or emulated actuator, respectively, in the form of the second actuator provides the possibility that, compared to a measuring of a prototype of a planned actuator, production tolerances of the emulator are compensated and are no longer of any consequence. In particular, different characteristics, such as force, rigidity and movement sequences of existing actuators may be simulated (emulated) and characteristics of new actuators may furthermore be predicted. In addition, load-related forces may be detected and may be returned into the electric network (in the simplest case as adjustable attenuation).

The present invention thus simplifies the development of actuators, in particular of piezoelectric actuators, because information relating to the anticipated behavior of the planned actuator may be acquired in a comparatively simple manner and because its behavior may be adapted accordingly. For instance, a electronic control circuit of the planned piezoelectric actuator may be adapted, for example, on the basis of the data acquired by the emulation, so as to ensure a control of the planned actuator in the frequency range. In particular, signs of wear of the planned, in particular piezoelectric actuator may thus be minimized, because the appearance of abrasions between the actuator and a load, which is to be moved, which are caused by an insufficient deflection of the actuator, may thus be avoided.

A design process for a piezoelectric actuator for developing a novel instrument for medical technology, for example, may furthermore be designed to be more efficient. In particular piezoelectric drives encompass possibilities in the case of the small available construction volume of an intracorporeal manipulator. Compared to electro-dynamic actuators, however, the design process for a piezoelectric drive may be considerably more extensive and complicated. For the aforementioned reasons, the invention leads to considerable possibilities, in particular in the case of the development of piezoelectric actuators for medical technology instruments.

Actuators comprising performance data of 5 N at 20 mm/s are not known for far, in particular in the desired power density range of 40 kW/m$^3$ in combination with the available construction volume of approximately 1000 mm$^3$, so that they must be fundamentally developed anew.

In particular the weak point, which is at hand in the case of the present development processes, which is that the development processes for an actuator, which are based on simulation or modeling processes, respectively, do not reach a sufficient, in particular mechanical coupling for an actuator between the simulation and an actual actor may be overcome by the present invention.

BRIEF DESCRIPTION OF THE DRAWINGS

Further features and possibilities of the invention result from the following description, in which exemplary embodiments of the invention will be defined in more detail by schematic drawings.

DETAILED DESCRIPTION OF EXEMPLARY EMBODIMENTS

The device according to the invention and the method according to the invention will be defined below by FIGS. 1 to 9 by the emulation of a piezoelectric actuator.

Figure 1:
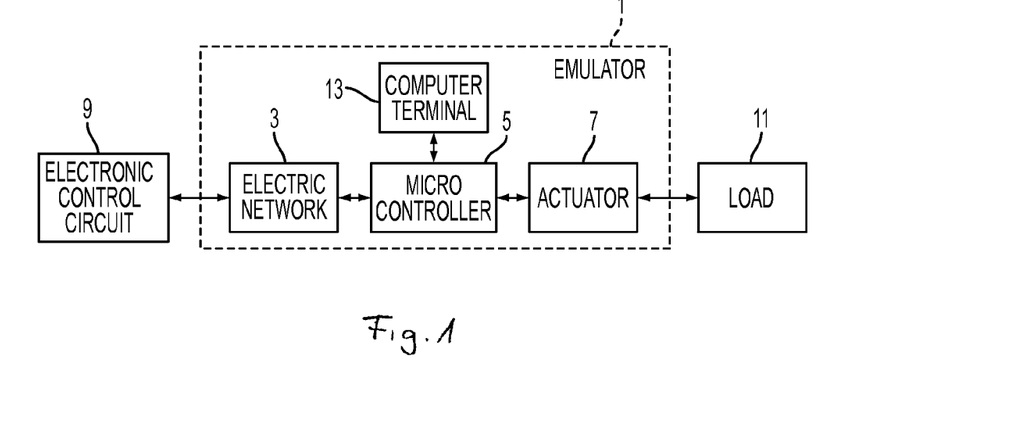
FIG. 1 shows a schematic block diagram of a device according to the invention

FIG. 1 illustrates the schematic design of a device according to the invention in the form of an emulator 1. The emulator 1 serves in particular to emulate a behavior of a first piezoelectric drive or actuator, respectively, which is still being developed, in particular.

To emulate the behavior of the first piezoelectric actuator or of the piezoelectric actuator, which is to be emulated, the emulator 1 encompasses an electric network 3, which is connected to a second piezoelectric actuator 7 via a first control unit in the form of a microcontroller 5. The electric network 3 may be connected to a electronic control circuit 9. The second piezoelectric actuator 7 may further be connected to a load 11. The emulator 1 furthermore encompasses a second control unit in the form of a computer terminal or PC 13, respectively. Even though FIG. 1 only indicates one possibility for the PC 13 to communicate with the microcontroller 5, the PC 13 makes it possible to generate control signals for the emulator 1 via a non-illustrated connection by the control electric circuit 9. As will be defined in the following, the emulator 1 makes it possible to simulate the behavior of the first piezoelectric actuator, which is connected in later applications to the electronic control circuit 9 and to the load 11 instead of the emulator 1.

Figure 2A:
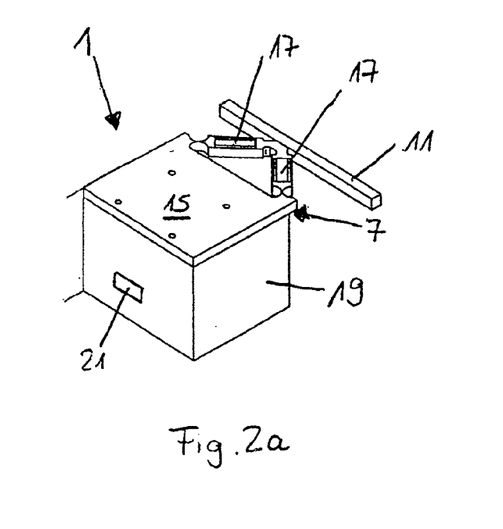
FIG. 2a shows a perspective top view onto a device according to the invention comprising a load, which is to be moved in a translatory manner.

FIG. 2a illustrates a top view onto a possible realization form of the emulator 1 of FIG. 1. The electronics for the adjustable electric impedance as well as the electronics for controlling the actuator as well as of range sensors are accommodated in the total design illustrated in FIG. 2. As may be seen in FIG. 2a, the second piezoelectric actuator 7 thereby comprises a basic drive body 15, to which two piezoelectric drive mechanisms in the form of stack actuators 17 are arranged. The piezoelectric actuator 7 may be brought into contact with a load 11, in particular for moving the load 11, by a connecting device in the form of an exchangeable tip, which is not illustrated in FIG. 2a. The load 11 illustrated in FIG. 2a is moved in a translatory manner by the emulator 1 or the second actuator 7, respectively.

Figure 2B:
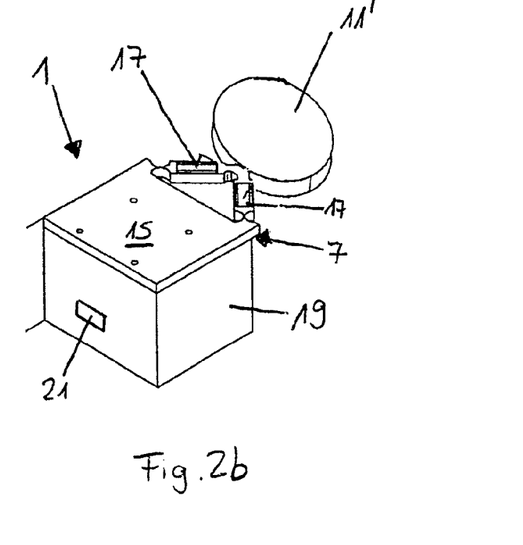
FIG. 2b shows a perspective top view onto the device according to the invention of FIG. 2a comprising a load, which is to be moved in a rotatory manner.

FIG. 2b illustrates a combination of the emulator 1 of FIG. 2a comprising a load 11'. The load 11' is a load, which is to be moved in a rotatory manner. Contrary to the load 11, which is substantially pin-shaped, the load 11' is disk-shaped.

The load 11, 11' may in particular be a ceramic element, while the connecting device may be embodied in the form of an exchangeable metal tip. A housing 19 for accommodating the electric network 3 as well as the microcontroller 5 is arranged below the basic drive body 15. The elements arranged in the housing 19 may be connected to the PC 13, which is not illustrated in FIGS. 2a and 2b, via a port 21, for example a USB connection.

Figure 3:
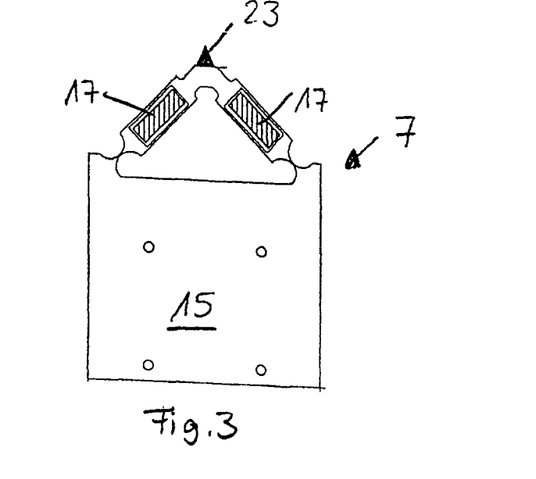
FIG. 3 shows a top view onto the device of FIG. 2a or of FIG. 2b, respectively.

By FIG. 3, the mode of operation of the second piezoelectric actuator 7 of FIGS. 2a and 2b will now be defined below. In particular, FIG. 3 illustrates the connecting device in the form of an exchangeable metallic tip 23, which may be brought into contact with a load, which is not illustrated in FIG. 3. The piezoelectric actuator 7 illustrated in FIG. 3 provides in particular for the emulation of actuators with a point-shaped or line-shaped individual contact to a load. As already mentioned above, the piezoelectric actuator 7 substantially comprises a mechanism, in which two piezoelectric stack actuators 17 are used. The stack actuators 17 may be operated independent on one another. To make it possible for the exchangeable tip 23 to pass through a plurality of different movements or trajectories, respectively, the stack actuators are operated independent on one another and not in resonance. In particular, the piezoelectric actuator 7 is designed in such a manner that the tip may carry out a circular, symmetrical movement, wherein a deflection of the tip 23 out of a standby position may be in the range of 10 µm. To make it possible for the second piezoelectric actuator 7 to pass through a predetermined movement or trajectory, respectively, provision is made for a regulation of the movement of the tip 23 or of the stack actuators 17, respectively, to be carried out in addition to a pure control of the stack actuators 17 of the emulator 1. In particular, such a regulation is necessary so as to observe movement changes, which may result from a change of the load of the tip in response to passing through the predetermined trajectory.

When carrying out this regulation, provision is made for the piezoelectric actuator 7 to encompass sensors, which may in particular be realized in the form of capacitive range sensors. These sensors, which are not illustrated in FIG. 3, make it possible to detect a movement of the tip 23 as accurately as to several nanometers. The use of the sensors further provides for the possibility that a speed and an acceleration of the tip 23 may be computed as soon as a movement of the tip 23 may be detected. With the knowledge of these variables, it then becomes possible to compute forces acting on the tip 23, in particular in response to contact with a load, and to compute therefrom the power, which must be applied so as to carry out a desired movement of the tip 23.

Due to the afore-mentioned design of the piezoelectric actuator 7, a regulation, which may be in the range of approximately 100 kHz despite the partially extremely high frequencies of the movement of the tip 23, provides for an initial regulation of the movement of the tip 23 by a trajectory, which is predetermined by a plurality of support locations, so that, due to the known values of range, speed and acceleration, it is possible to predetermine a trajectory not only in the average of individual oscillation processes, but to maintain each individual trajectory accurately and for each passage.

It is the central idea of the present invention for the behavior of the planned piezoelectric actuator to be simulated or emulated, respectively, by the actually existing second piezoelectric actuator 7, wherein the electric network 3 serves the purpose of simulating the electric characteristics of the first piezoelectric actuator, in particular to provide an electric impedance of the planned piezoelectric actuator for the control electric circuit 9. Based on a transformer equivalent circuit diagram illustrated in FIG. 4a, a simplified transformer equivalent circuit diagram for piezoelectric transformers or actuators, respectively, which is illustrated in FIG. 4b, may be assumed for the determination of the parameters of the electric network 3.

Figure 4A:
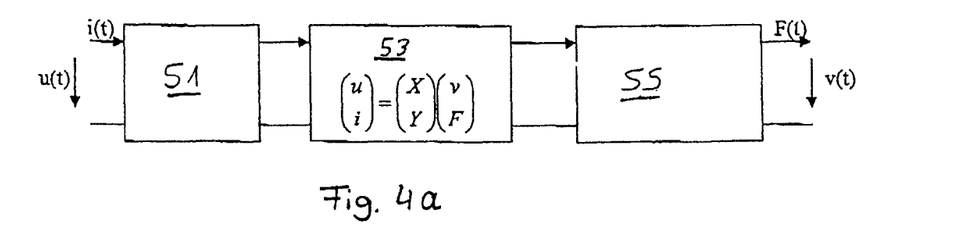
FIG. 4a shows a transformer equivalent circuit diagram of a general actuator.

According to the transformer equivalent circuit diagram illustrated in FIG. 4a, a control signal in the form of a voltage u(t) and of a current i(t) is applied to an electric network 51. The electric network 51 combines the electric characteristics of the transformer or of the actuator, respectively. The electric network 51 is connected via a coupling quadripole 53 to a mechanical network 55, which causes the generation of an output signal in the form a force F(t) and speed v(t). This transformer equivalent circuit diagram allows for the description of any transformers or actuators, respectively, wherein the electric network may encompass capacitive characteristics, inductive characteristics and ohmic resistance characteristics. In response to a conversion into an actual network, these may be realized by passive and/or active components. For instance, the electric network may comprise a reproduction of an engine control for emulating an electromotor. By a coupling quadripole 53, a transformation of the voltage signal u and current signal i, which are applied at the output of the electric network 51, into speed values v and force values F takes place by a transformatory coupling factor X and a gyratory coupling factor Y.

Figure 4B:
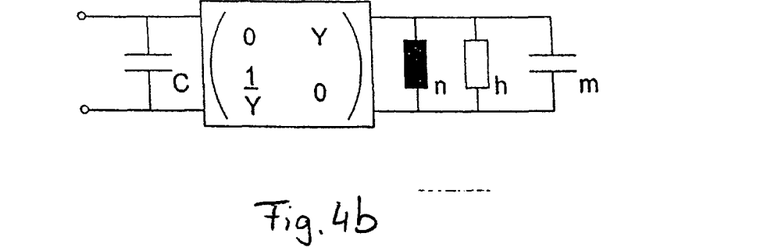
FIG. 4b shows a transformer equivalent circuit diagram of a piezoelectric actuator.

In the transformer equivalent circuit diagram of FIG. 4b for a piezoelectric actuator, the input capacitance C represents the electric capacitance of the planned actuator, while the compliance n represents the mechanical contact follow h and the mass m represents the mechanical characteristics of the planned actuator in a simplified manner. Y represents the transformer constant of the piezoelectric actuator, wherein it may be determined according to $$Y = \frac{s^E}{d} \cdot \frac{l_{mech}}{A_{el}}$$

$s^E$ hereby represents the expansion of the piezoelectric actuator in the case of a constant electric field, d represents the piezoelectric charge constant, that is, the expansion of the piezoelectric actuator per voltage unit, $l_{mech}$ represents the thickness of the piezoelectric material and $A_{el}$ represents the surface of the electrode, which is connected to the piezoelectric material. It is thereby assumed that $$A_{el} \cdot l_{el} = A_{mech} \cdot l_{mech}$$

applies, wherein $l_{el}$ represents the distance between electrodes of the piezoelectric element and $A_{mech}$ represents the surface of the piezoelectric material. The transformer constant Y is thus substantially predetermined by the geometric characteristics and the characteristics of the piezoceramics of the planned piezoelectric actuator and may be determined by simulation computations or measuring of a prototype of the planned piezoelectric actuator, respectively.

Figure 5:
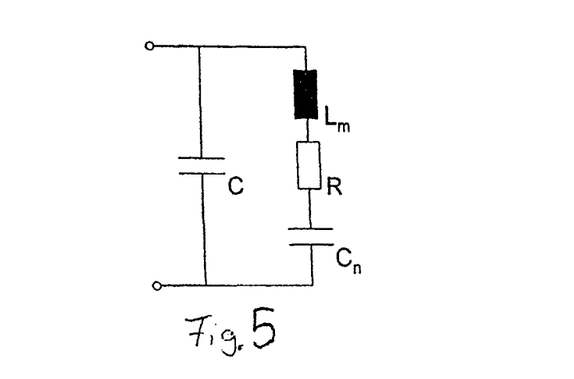
FIG. 5 shows a first embodiment of an electric network of a device according to the invention.

FIG. 5 illustrates an electronic realization of the transformer equivalent circuit diagram of FIG. 4. The circuit illustrated in FIG. 5 represents a possible embodiment of the electric network 3, wherein the circuit represents an elementary cell. This elementary cell in particular comprises a first capacitance arrangement in the form of a capacitor C, to which a series connection of a first inductance arrangement in the form of an inductance $L_m$, a second capacitance arrangement in the form of a capacitor $C_n$ and a resistance arrangement in the form of an ohmic resistance R is switched in parallel. This circuit of the electric network 3 clarifies that the piezoelectric actuator is a gyrator. This means that the piezoelectric actuator represents a dual inverter, thus that an inductive input behavior is present in response to a capacitive output load, while a capacitive input behavior is present in response to an inductive output load.

When carrying out an emulation of the planned piezoelectric actuator, a first parameter of the electric network 3 is initially adjusted according to the method according to the invention. For this, in particular the capacitances C, $C_n$, the inductance $L_m$ as well as the resistance R are adjusted. In particular, this takes place once prior to carrying out an emulation process, wherein these values may be determined in particular from the transformer constant Y of the piezoelectric actuator, which is to be developed. To determine the parameters of the electric network 3, further parameters of the planned actuator, which are known prior to the emulation, may be used as an alternative or in addition thereto. The transformer constant is in particular determined by simulation computations of the first piezoelectric actuator or is established by measuring a prototype of the first piezoelectric actuator. The electric network 3 is in particular adjusted in that the transformer constant is transferred via the PC 13 to the microcontroller 5, which then conducts a corresponding adaptation of the individual elements of the electric network 3. In response to a subsequent emulation of the planned first piezoelectric actuator, corresponding signals for moving the second piezoelectric actuator 7 along a predetermined trajectory are applied to the emulator via the electronic control circuit 9. This makes it possible for movement patterns of the first piezoelectric actuator, which have not been simulated so far, to be passed through by the second piezoelectric actuator 7, thus for the second actuator 7 to imitate a movement of the planned piezoelectric actuator. By the emulator 1, a predicted reaction of the planned first piezoelectric actor at predetermined controlling signals may be determined.

The embodiment of the electric network illustrated in FIG. 5 represents a basic form for adjusting static parameters of the emulator 1. In non-illustrated embodiments provision may be made for the electric network to encompass a plurality of elementary cells, which are connected in series, as they are illustrated in FIG. 5. This makes it possible in particular for not only one resonance frequency of the first piezoelectric actuator to be capable of being emulated, but also for higher harmonic resonances to be capable of being emulated by the emulator 1.

Figure 6:
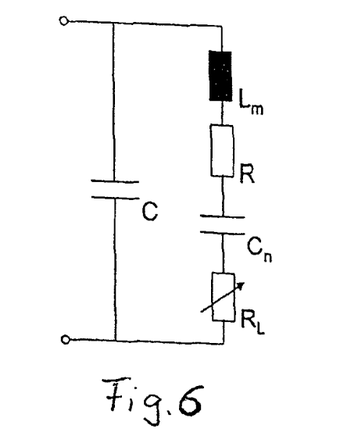
FIG. 6 shows a second embodiment of an electric network of a device according to the invention comprising an adjustable resistance.

The emulator 1 furthermore makes it possible for load states of the first piezoelectric actuator to be capable of being emulated or simulated, respectively. Such an imitation is in particular attained by the expansion of the electric network, which is illustrated in FIG. 6. A second electric resistance arrangement in the form of a changeable resistance $R_I$ is integrated into the electric network 3. To be capable of emulating a piezoelectric actuator, the resistance value of the changeable resistance $R_L$ is changed during the performance of an emulating process by the microcontroller 5. This change may take place in particular due to data, which are available by a distance measurement of the tip. As already explained above, the distance measurement makes it possible to compute a speed and acceleration of the tip, from which, in particular with the knowledge of a load applied to the tip, it is possible to compute a force acting on the tip and a power, which is necessary for a movement of the tip. This makes it possible to carry out a feedback to the electric side of the emulator in the form of the electric network, in that the load is accommodated in the electric network as a variable resistance. Load impacts or oscillating loads may thus be imitated, for example. At least a third parameter of the planned first piezoelectric actuator, which cannot be determined or which may only be determined insufficiently by a simulation or a measuring of a prototype of the first piezoelectric actuator, may furthermore be determined by the emulation process. This may be a parameter, for example, which relates to non-linear effects of the piezoceramics of the planned actuator. The third parameter, which is determined in such a manner, may be used in particular so as to be used in a renewed simulation of the planned first piezoelectric actuator, so as to provide for a more precise simulation of the planned first piezoelectric actuator.

Figure 7:
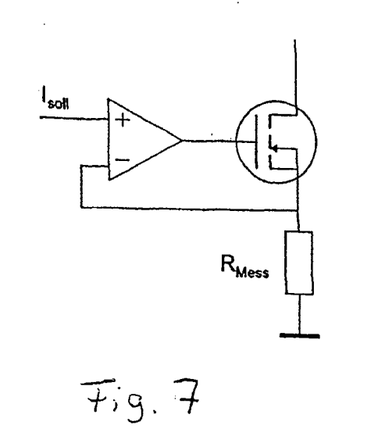
FIG. 7 shows a circuit diagram of a possible realization of an adjustable resistance of the electric network of FIG. 6.
Figure 8:
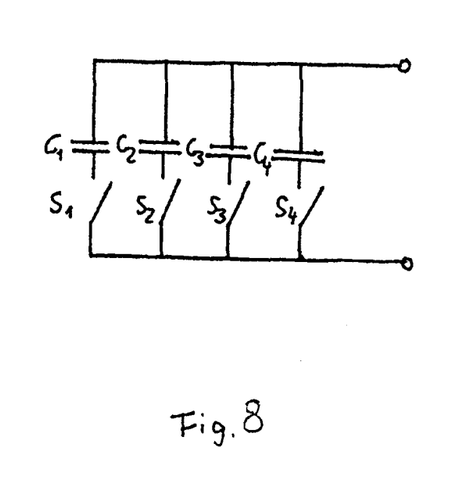
FIG. 8 shows a circuit diagram of a capacitance arrangement, which may be used in a device according to the invention, for adjusting different capacitance values.

FIGS. 7 and 8 illustrate possibilities of the realization of the changeable resistance $R_L$ (FIG. 7) and of the capacitance arrangement of the circuit of FIGS. 5 and 6 (FIG. 8). The changeable resistance $R_L$ according to FIG. 7 is realized by a controlled semiconductor e.g. a MOSFET. According to FIG. 8, the respective capacitance arrangements of the circuits of FIGS. 5 and 6 may be realized by a network of individual capacitors $C_1$, $C_2$, $C_3$, $C_4$. For instance, the capacitor $C_1$ may encompass a capacitance value of 1 µF, the capacitor $C_2$ may encompass a capacitance value of 2 µF, the capacitor $C_3$ may encompass a capacitance value of 4 µF and the capacitor $C_4$ may encompass a capacitance value of 8 µF. Different capacitance values may be realized in this manner by a suitable actuation of circuits $S_1$, $S_2$, $S_3$, $S_4$. In response to the actuation of the circuits $S_4$ and $S_1$, a capacitance value of 5 µF may thus be adjusted. It becomes clear from this that the capacitance arrangements C, $C_n$ or the inductance arrangement Lm, respectively, and the resistance arrangement R may be realized from a changeably switched network of resistances, capacitors and/or inductances.

By suitably switching the elements of the network, the impedance of the planned piezoelectric actuator, which is obtained by the analytic description of the first piezoelectric actuator or by the simulation of the first piezoelectric actuator, may be imitated by the electric network 3.

Even though the design of the electric network 3 has been described above by passive components, active components may also be used in the electric network 3.

Figure 9:
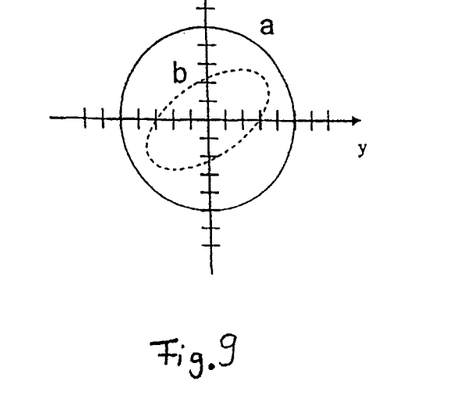
FIG. 9 shows an application of different trajectories, which may be passed through by a second piezoelectric actuator of a device according to the invention.

FIG. 9 illustrates exemplary trajectories, which may be traced by the tip 23. The trajectory (a) represents a circular symmetrical movement. However, any other trajectories may also be traced within the plane. For instance, the trajectory (b) shows an elliptical shape, wherein the trajectory in response to an emulation process may not be static, but may also change over time, e.g. may rotate clockwise or may change its shape.

In summary, the emulator 1 makes it possible to imitate any, in particular piezoelectric drives. In particular the use of the second regulation and/or control unit in the form of the PC 13 makes it possible for profiles of different drives to be detected by measuring techniques and to be stored on the PC so as to be accessible immediately, so as to be loaded on the emulator 1, in particular in the microcontroller 5, as needed. The emulator 1 thereby provides the possibility that the desired drive may be imitated directly by the emulator 1, without the other characteristics thereof, such as aging or wear, having a negative impact in response to the emulation of the drive.

In particular, the emulator 1 makes it possible for the focus of the emulation to be directed to the function of the planned piezoelectric actuator, without the necessity of having to consider production tolerances or the like. Corresponding functions of the actuator are in particular, which movement amplitude a planned drive may reach and whether these are sufficient for the desired use; what effect production tolerances may have and how a wear of the actuator may effect an abrasion contact. For instance, the measuring of an actual prototype of a planned piezoelectric actuator or of an actuator, which has been taken from a current series production, allows for statements relating to the tolerances occurring in the case of the actual actuators may be made by the test runs, which are carried out by the emulator. The afore-described novel actuator systems may be imitated or emulated, respectively, in particular when using a second piezoelectric actuator, which encompasses high cut-off frequencies or high resonance frequencies, respectively.

Even though the method according to the invention and the device according to the invention have been described by FIGS. 1 to 9 by the emulation of a piezoelectric actuator, the invention is not limited to the emulation of such actuators. For instance, the device according to the invention and the method according to the invention provides for the emulation of any drives, for example also the emulation of a combustion engine, of an electromotor, of an electromagnet, of an electrostatic actuators, of a magneto-resistive actuators or of an electro-active polymer. The emulation of these actuators is thereby not limited to the fact that an actuator is emulated in that the second actuator or the emulating actuator, respectively, is an actuator having the same principle of operation. For instance, it is possible for a first actuator or an actuator in the form of a combustion engine, which is to be emulated, respectively, to be emulated by a second actuator or an actuator, which is to be emulated, in the form of an electromotor. The emulating and the emulated actuator or drive, respectively, must thus not encompass the same design, configuration or the same principle of operation. However, technical data or characteristics with reference to defined ports or variables/properties, respectively, e.g. of the coupling of a mechanical performance into a load or of an electrical connection, respectively, to a control electronic, must be considered. The first actuator or the emulated actuator, respectively, and the emulating actuator or the second actuator, respectively, must be comparable only with reference to these defined ports. The emulating actuator or the device for emulation, respectively, should furthermore encompass identical or improved performance data with reference to these variables.

It is thereby particularly possible when different actuator profiles may be stored in the first or second control unit, respectively, and when these different actuator profiles may thus be recalled by the device according to the invention and be used for the emulation process. Provision may thereby in particular be made for a change between different actuator profiles to be carried out during an emulation process. This means in particular that the respective parameters of the electric network are adapted as a function of an actuator profile, which is loaded into the control unit. The storing of the different actuator profiles may provide for the selection of different drive alternatives for assessing a performance. For instance, provision may be made for different actuators to be emulated by the device according to the invention and for a suitable actuator to be chosen in that an actuator that satisfies certain requirements is found by "trial and error".

This characteristic of the device according to the invention or of the method according to the invention, respectively, provides the possibility that it becomes possible for a required actuator or for an actuator, which is requested by a customer, to not have to be built into an end device, so as to check the characteristics of the end device. For instance, a device according to the invention may be integrated into a system, which comprises an emulation unit. The emulation unit is thereby in particular the corresponding end device, such as a motor vehicle. Instead of installing a certain actuator into the end device, a device according to the invention may be built into the emulation unit, by which the actuators or drive alternatives, respectively, which are offered for the end device, for example the engine vehicle, may be simulated. This emulation unit, which is not sold to the customer, may imitate the characteristics of all of the offered drive alternatives.

Figure 10:
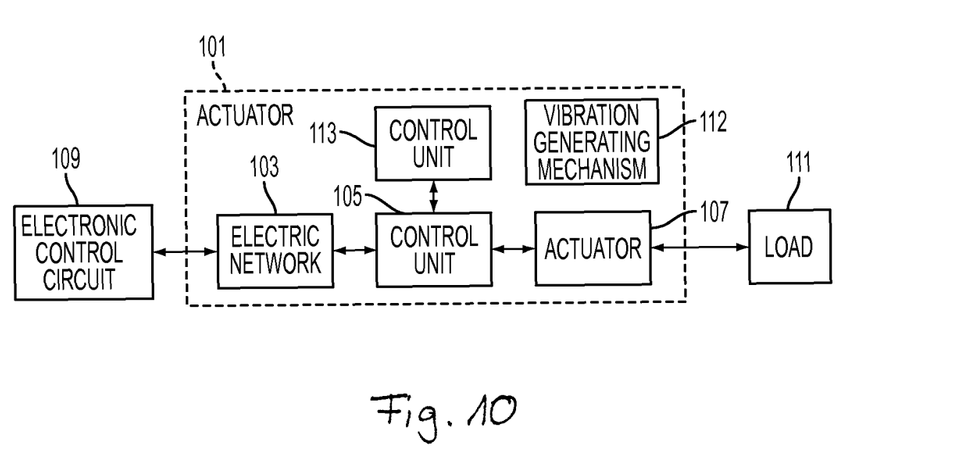
FIG. 10 shows a schematic block diagram of a further embodiment of a device according to the invention.

For this purpose, a device according to the invention, which may be built into an emulation unit, may encompass the design illustrated in FIG. 10. The device according to the invention in the form of the emulator 101 encompasses an electric network 103, a first control unit in the form of a microcontroller 105 as well as a second actuator 107 and a second control unit 113. The emulator 101 receives a control signal, which is generated by a electronic control circuit 109, and transfers a mechanical performance to a load 111, such as a drive unit of the emulation unit. The second emulator 107 may in particular be an electromotor. The emulator 101, however, is suitable to not only imitate actuators, which encompass the same structural type as the second actuator 107, but it is possible, for example, for a combustion engine to be emulated by the emulator 101. When installing the emulator 101 into an emulation unit in the form of a motor vehicle, different drive alternatives may be adjusted while test-driving a motor vehicle, so that a driver of the motor vehicle may test different alternatives of the drive, for example a 4-cylinder drive or a V12 drive. So as not to influence the characteristics of the emulation system or of the emulation unit, respectively, in particular the vehicle, provision may be made for the system to encompass a power supply unit, which is embodied so as to be separated from the emulation unit. For instance, the characteristics of a motor vehicle, such as an acceleration of the vehicle, may be influenced by the weight and the space requirement of a power supply unit, such as batteries, e.g., in response to the use of a motor as a second actuator. To avoid this, the power supply may be removed, thus being arranged in an accompanying vehicle, for example, wherein the emulation unit or the emulation vehicle, respectively, and the power supply unit are connected to one another by cables, e.g. It is particularly positive hereby when the accompanying vehicle is controlled or regulated, respectively, by the emulator with reference to the distance and relative speed to the emulation vehicle.

Such a system, however, not only provides for the emulation of already available drives, but may in particular also be used for determining demands on a drive, which is to be developed. For instance, the emulator may be built into the emulation unit, because the characteristics of the emulator may be randomly changed by a customer, in particular desired performances and performance nuances may be determined. These are then available to the vehicle as end conditions for the subsequent construction of a drive for the vehicle. The system may thus in particular be characterized in that a performance or performance nuances, respectively, of drive alternatives may be determined by changing a delivered performance of the emulator by objective and/or subjective criteria.

In the case of the emulation of different drive concepts, it is particularly possible for the emulator according to the invention to make it possible for characteristics of additional units, such as brakes, couplers or transmissions of a vehicle to also be capable of being emulated by determining the resulting influences and by considering these influencing factors by the device according to the invention. In a particular embodiment of the invention, the actuator 101 may encompass a vibration generating mechanism 112, which may in particular be operatively connected to the first control unit 105. This may make it possible for additional vibrations in the audible and/or inaudible range, as they occur, e.g., by a movement of pistons in a combustion engine, torque fluctuations or noises of the actuator, which is to be emulated, to be imitated.

A direct and objective comparison may hereby be carried out between the useful characteristics, which are created by the emulated actuator, such as force, torques and speed and the parasitic or non-useful characteristics, respectively, e.g., noise and mechanical vibrations, as they may be created at a carriage of a motor vehicle. As an example, the emulator 101 provides for a direct comparison between Otto engines and diesel engines to be carried out.

The features of the invention disclosed in the afore description, in the claims as well as in the drawings may be important for the realization of the invention, either individually as well as in any combination.

It should be noted that the term 'comprising' does not exclude other elements or steps and the 'a' or 'an' does not exclude a plurality. Also elements described in association with different embodiments may be combined.

It should also be noted that reference signs in the description shall not be construed as limiting the scope of the claims.

LIST OF REFERENCE NUMERALS

1 emulator
3 electric network
5 microcontroller
7 piezoelectric actuator
9 electronic control circuit
11, 11' load
13 PC
15 basic drive body
17 stack actuator
19 housing
21 port/interface
23 tip
51 electric network
53 coupling quadripole
55 mechanical network
101 emulator
103 electric network
105 microcontroller
107 actuator
109 electronic control circuit
111 load
112 vibration generating mechanism
113 control unit
$C, C_n, C_1, C_2, C_3, C_4$ capacitor
$S_1, S_2, S_3, S_4$ circuits
$L_m$ inductance
R resistance
n flexibility
h mechanical contact follow
m mass
a, b trajectory

The invention claimed is:

1. A device for emulating a vehicle engine, comprising:
at least one electric network connectable to at least one electronic control circuit;
at least one control unit; and
at least one actuator,
wherein the at least one electric network is operatively connected to the at least one actuator by the at least one first control unit,
wherein the at least one electric network has at least one parameter,
wherein the device for emulating a vehicle engine encompasses defined properties with reference to technical characteristics, said properties covering at least corresponding properties of the vehicle engine that is to be emulated,
wherein the at least one control unit varies the at least one parameter of the at least one electric network so that the technical characteristics of the device for emulating the vehicle engine match those of the vehicle engine that is to be emulated,
wherein the technical characteristics comprise one of an electrical impedance and a mechanical impedance.

2. The device according to claim 1, wherein different profiles of the vehicle engine are stored in the control unit to be retrieved.

3. The device according to claim 2, wherein the at least one parameter of the at least one electric network may be adapted as a function of a profile, which is stored in the first control unit.

4. The device according to claim 1, wherein the actuator is operatively connected to at least one sensor for detecting at least one from a group, the group consisting of:
a deflection of the actuator in at least one spatial direction, and
a trajectory of a connecting device in the form of an exchangeable tip.

5. The device according to claim 1, wherein at least one electric impedance of the vehicle engine is emulatable by the at least one electric network in such a manner that the excitation of the actuator causes the device to exhibit at least one electric impedance of the vehicle engine.

6. The device according to claim 1, wherein the at least one electric network comprises:
at least one elementary cell, the elementary cell comprises at least a first electric capacitance arrangement and a series connection, wherein the series connection is connected parallel to the first electric capacitance arrangement, the series connection comprises at least one out of a group, the group consisting of:
an electric inductance arrangement,
a second electric capacitance arrangement, and
a first electric resistance arrangement.

7. The device according to claim 6, wherein at least one of the elementary cells comprises at least a second electric resistance arrangement, wherein the second electric resistance arrangement is variable and comprises at least one semiconductor component.

8. The device according to claim 1, wherein the device is in the form of an emulation unit and comprises at least one vibration generating mechanism, wherein the vibration generating mechanism is designed to transfer vibrations to the emulation unit.

9. The device according to claim 8, wherein the at least one vibration generating mechanism is designed to generate vibrations in at least one range out of a group, the group consisting of:
an infrasound range,
an audible range,
an inaudible range, and
an ultrasonic range.

10. The device according to claim 1, wherein the device is in the form of an emulation unit, further comprising:
a power supply unit,
wherein the power supply unit is embodied so as to be separated from the emulation unit, in the form of a vehicle, which is separated from the emulation unit, in that the power supply unit and the emulation unit are embodied in the form of different vehicle types.

11. The device according to claim 1, wherein a vehicle containing the device for emulating the vehicle engine imitates characteristics of a vehicle containing the vehicle engine.

12. The device according to claim 11, wherein the device for emulating the vehicle engine is adapted to imitate the characteristics of a virtual vehicle engine.

13. A device for emulating a first actuator comprising:
at least one electric network connectable to at least one electronic control circuit;
at least one control unit; and
at least one second actuator,
wherein the at least one electric network is operatively connected to the at least one second actuator by the at least one first control unit,
wherein the at least one electric network has at least one parameter,
wherein the device for emulating a first actuator encompasses defined properties with reference to technical characteristics, said properties covering at least corresponding properties of the first actuator that is to be emulated, and
wherein the at least one control unit varies the at least one parameter of the at least one electric network so that the technical characteristics of the device for emulating the first actuator match those of the first actuator that is to be emulated,
wherein the technical characteristics comprise one of an electrical impedance and a mechanical impedance.

14. A device for emulating a vehicle engine, comprising:
at least one electric network connectable to at least one electronic control circuit;
at least one control unit; and
at least one actuator,
wherein the at least one electric network is operatively connected to the at least one actuator by the at least one first control unit,
wherein the at least one electric network has at least one parameter comprising one or more of a resistance, a capacitance, and an inductance,
wherein the at least one control unit varies the at least one parameter of the at least one electric network so that technical characteristics of the device for emulating the vehicle engine correspond to those of the vehicle engine that is to be emulated,
wherein the technical characteristics comprise one of an electrical impedance and a mechanical impedance.

* * * * *